US006787447B2

(12) United States Patent
Givens

(10) Patent No.: US 6,787,447 B2
(45) Date of Patent: *Sep. 7, 2004

(54) SEMICONDUCTOR PROCESSING METHODS OF FORMING INTEGRATED CIRCUITRY

(75) Inventor: John H. Givens, San Antonio, TX (US)

(73) Assignee: Micron Technology, Inc., Boise, ID (US)

( * ) Notice: Subject to any disclaimer, the term of this patent is extended or adjusted under 35 U.S.C. 154(b) by 126 days.

This patent is subject to a terminal disclaimer.

(21) Appl. No.: 09/952,897

(22) Filed: Sep. 11, 2001

(65) Prior Publication Data

US 2002/0048932 A1 Apr. 25, 2002

Related U.S. Application Data

(63) Continuation of application No. 09/111,359, filed on Jul. 6, 1998, now Pat. No. 6,319,813.

(51) Int. Cl.[7] ......................................... H01L 21/4763
(52) U.S. Cl. ........................ 438/624; 438/637; 438/638
(58) Field of Search ................................ 438/622, 624, 438/637, 638

(56) References Cited

U.S. PATENT DOCUMENTS

| | | |
|---|---|---|
| 4,832,789 A | 5/1989 | Cochran et al. |
| 5,518,963 A | 5/1996 | Park |
| 5,595,937 A | 1/1997 | Mikagi |
| 5,598,027 A | 1/1997 | Matsuura |
| 5,612,254 A | 3/1997 | Mu et al. |
| 5,635,423 A | 6/1997 | Huang et al. |
| 5,635,432 A | 6/1997 | Honda et al. |
| 5,702,982 A | 12/1997 | Lee et al. |
| 5,726,100 A | 3/1998 | Givens |
| 5,880,018 A | 3/1999 | Boeck et al. |
| 5,891,799 A | 4/1999 | Tsui |
| 5,980,657 A | 11/1999 | Farrar et al. |
| 5,989,997 A | * 11/1999 | Lin et al. ..................... 438/622 |
| 6,042,999 A | * 3/2000 | Lin et al. ..................... 430/316 |
| 6,054,768 A | 4/2000 | Givens et al. |

(List continued on next page.)

OTHER PUBLICATIONS

Carter et al., "Dual Damascene: A USLI Wiring Technology", Jun. 11–12, 1991, pp. 144–152, VMIC Conference, 1991 IEEE.
T. Licata et al., "Dual Damascene AI Wiring For 256M Dram", Jun. 27–29, 1995, pp. 596–602, VMIC Conference, 1995 ISMIC—104/95/0596.
H.J. Barth, "Integration Aspects Of A Hi–Fill Barrier With A High Pressure Aluminum Contact Fill", Jun. 27–29, 1995, pp. 52–58, VMIC Conference, 1195 ISMIC—104/95/0052.
C. Dobson et al., A 3–Level 0.35um interconnection process using an innovative high pressure aluminium plug technology, pp. 31–37, Jun. 27–29, 1995, VMIC Conference, 1995 ISMIC—104/95/0031.

Primary Examiner—George Fourson
Assistant Examiner—Fernando Toledo
(74) Attorney, Agent, or Firm—Wells St. John P.S.

(57) ABSTRACT

Semiconductor processing methods of forming integrated circuitry are described. Embodiments provide a substrate having circuit devices. At least three layers are formed over the substrate and through which electrical connection is to be made with at least two of the circuit devices. The three layers comprise first and second layers having an etch stop layer interposed therebetween. Contact openings are formed through the three layers and a patterned masking layer is formed over the three layers to define a conductive line pattern. Material of an uppermost of the first and second layers is selectively removed, relative to the etch stop layer, to define troughs joined with the contact openings. Conductive material is subsequently formed within the joined troughs and contact openings. In some embodiment, contact openings are formed that have an aspect ratio of no less than about 10:1.

31 Claims, 4 Drawing Sheets

U.S. PATENT DOCUMENTS

| | | |
|---|---|---|
| 6,057,227 A | 5/2000 | Harvey |
| 6,057,231 A | 5/2000 | Givens et al. |
| 6,057,239 A * | 5/2000 | Wang et al. ............... 438/689 |
| 6,060,386 A | 5/2000 | Givens |
| 6,080,655 A | 6/2000 | Givens et al. |
| 6,091,148 A | 7/2000 | Givens et al. |
| 6,200,895 B1 | 3/2001 | Givens et al. |
| 6,271,593 B1 | 8/2001 | Givens et al. |
| 6,297,156 B1 | 10/2001 | Farrar et al. |
| 6,316,356 B1 | 11/2001 | Farrar et al. |
| 6,319,813 B1 * | 11/2001 | Givens ....................... 438/624 |
| 6,461,963 B1 | 10/2002 | Givens et al. |
| 6,482,735 B1 | 11/2002 | Givens et al. |
| 6,534,408 B2 | 3/2003 | Givens et al. |
| 2002/0006719 A1 | 1/2002 | Farrar et al. |
| 2002/0033498 A1 | 3/2002 | Farrar et al. |
| 2003/0045093 A1 | 3/2003 | Givens et al. |

* cited by examiner

SEMICONDUCTOR PROCESSING METHODS OF FORMING INTEGRATED CIRCUITRY

RELATED PATENT DATA

This patent resulted from a continuation application of U.S. Patent application Ser. No. 09/111,359 filed on Jul. 6, 1998 now U.S. Pat. No. 6,319,813.

TECHNICAL FIELD

This invention relates to semiconductor processing methods of forming integrated circuitry, and in particular, to dual damascene processing methods, and resultant integrated circuitry constructions.

BACKGROUND OF THE INVENTION

Interconnection techniques are used in semiconductor processing to electrically interconnect devices over a semiconductor wafer. Historically, the semiconductor industry has used subtractive etch or lift off techniques as a primary metal-patterning technique. Subtractive techniques typically involve depositing a metal layer over a wafer and subsequently masking and etching metal material from over undesired portions of the wafer. Escalating density, performance, and manufacturing requirements associated with semiconductor wiring have led to changes in interconnection technology. To meet these needs, a technology called dual damascene has been developed. See for example, Kaanta, *Damascene: A ULSI Wiring Technology*, VMIC Conference, Jun. 11–12, 1991, page 144–152; Licata, *Dual Damascene AL Wiring* for 256M DRAM, VMIC Conference, Jun. 27–29, 1995, pages 596–602; U.S. Pat. Nos. 5,595,937, 5,598,027, 5,635,432, and 5,612,254.

This invention arose out of concerns associated with providing improved semiconductor processing methods and structures. In particular, the invention arose out of concerns associated with providing improved processing methods and structures which utilize and comprise dual damascene interconnection technology.

SUMMARY OF THE INVENTION

Semiconductor processing methods of forming integrated circuitry, and in particular, methods of forming such circuitry utilizing dual damascene technology, and resultant integrated circuitry constructions are described. In one embodiment, a substrate is provided having a circuit device. At least three layers are formed over the substrate and through which electrical connection is to be made with the circuit device. The three layers comprise first and second layers having an etch stop layer interposed therebetween. A contact opening is formed through the three layers and a patterned masking layer is formed over the three layers to define a conductive line pattern. Material of an uppermost of the first and second layers is selectively removed relative to the etch stop layer and defines a trough joined with the contact opening. Conductive material is subsequently formed within the trough and contact opening. In another embodiment, a contact opening is formed through a plurality of layers and has an aspect ratio of no less than about 10:1. A trench is defined in an uppermost layer of the plurality of layers proximate the contact opening. Conductive material is formed within the contact opening and at least a portion of the trench, with the conductive material being in electrical communication.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
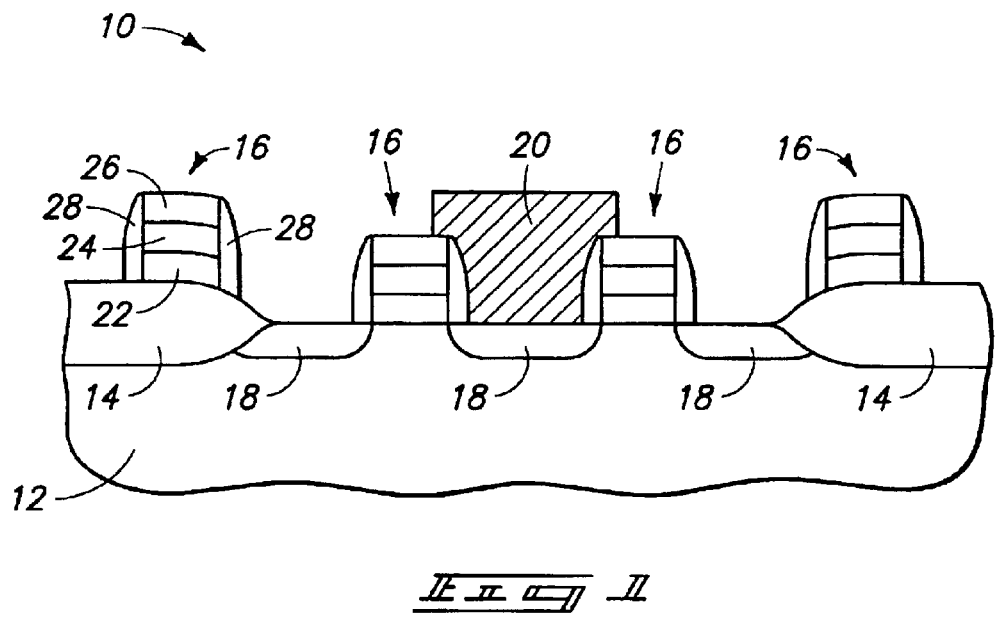
FIG. 1 is a diagrammatic sectional view of a semiconductor wafer fragment in process in accordance with one embodiment of the invention.

Referring to FIG. 1, semiconductor wafer fragment in process is indicated generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 comprises a bulk monocrystalline substrate and includes field oxide regions 14. Various circuit devices with which electrical communication is desired are provided over or within substrate 12. In the illustrated example, such circuit devices include a plurality of conductive lines 16, diffusion regions 18, and a conductive plug 20. Conductive lines 16 typically include a polysilicon layer 22, a silicide layer 24, and an overlying insulative cap 26. Sidewall spacers 28 are typically provided over layers 24–26 as shown. Diffusion regions 18 can include any type of diffusion region, i.e. n+ or p+. Conductive plug 20 typically includes materials such as conductively doped polysilicon. Circuit devices 16, 18, and 20 are shown for illustrative purposes only. Accordingly, other circuit devices are possible and can include other interconnect material.

Figure 2:
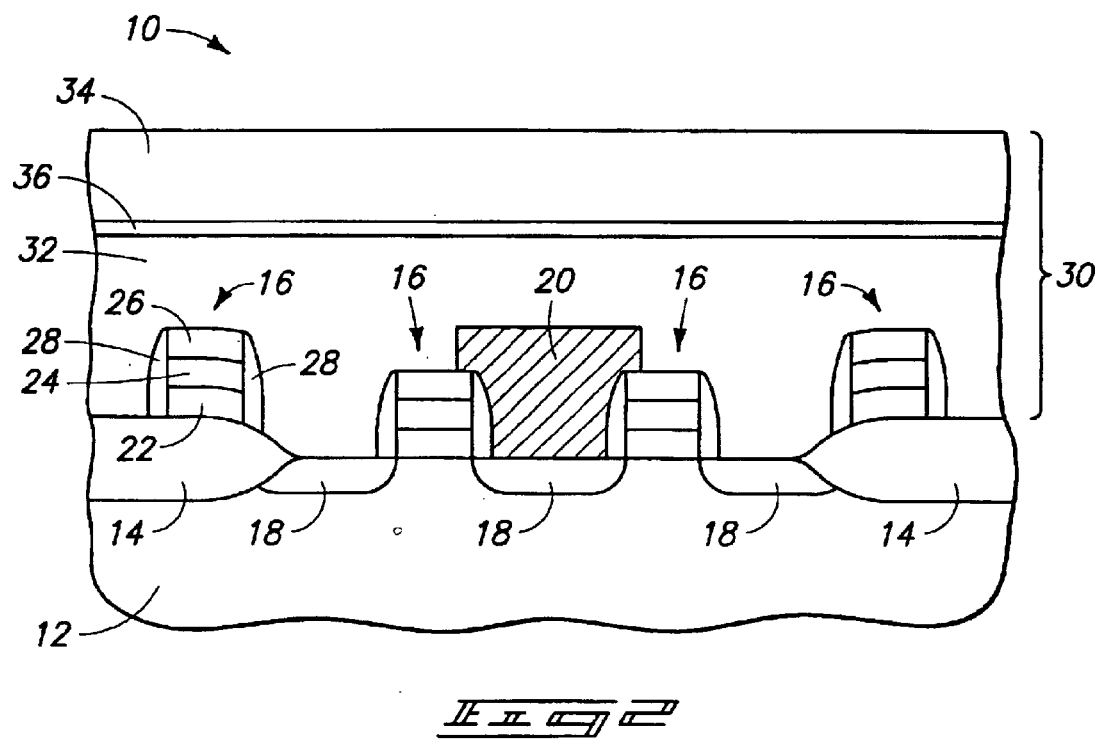
FIG. 2 is a view of the FIG. 1 wafer fragment at a different processing step.

Referring to FIG. 2, a plurality of layers 30 are formed over substrate 12. In the illustrated example, three layers are formed over the substrate and include a first layer 32, a second layer 34 spaced apart from first layer 32, and an intervening third layer 36 separating the first and second layers. The illustrated layers constitute layers through which electrical connection is to be made with at least one, and preferably more, circuit devices. In a preferred embodiment, third layer 36 constitutes an etch stop layer for purposes which will become evident below.

Preferably, first layer 32 comprises a first insulative oxide layer which is formed over the substrate, and subsequently planarized as by mechanical abrasion, e.g. chemical mechanical polishing (CMP), or etchback techniques. An exemplary material is borophosphosilicate glass (BPSG) formed to a thickness of around 20,000 Angstroms. Etch stop layer 36 is preferably a nitride-comprising material such as silicon nitride, and can be formed or deposited over first layer 32 through plasma enhanced chemical vapor deposition techniques to an exemplary thickness of from 250 Angstroms to 10,000 Angstroms, with 300 Angstroms being preferred. For purposes of the ongoing discussion, layer 36 constitutes a next adjacent layer relative to layer 34. An exemplary material for layer 34 comprises an oxide material such as undoped $SiO_2$, which can be deposited by decomposition of tetraethylorthosilicate (TEOS). An example thickness is between about 5000 to 10,000 Angstroms.

Figure 3:
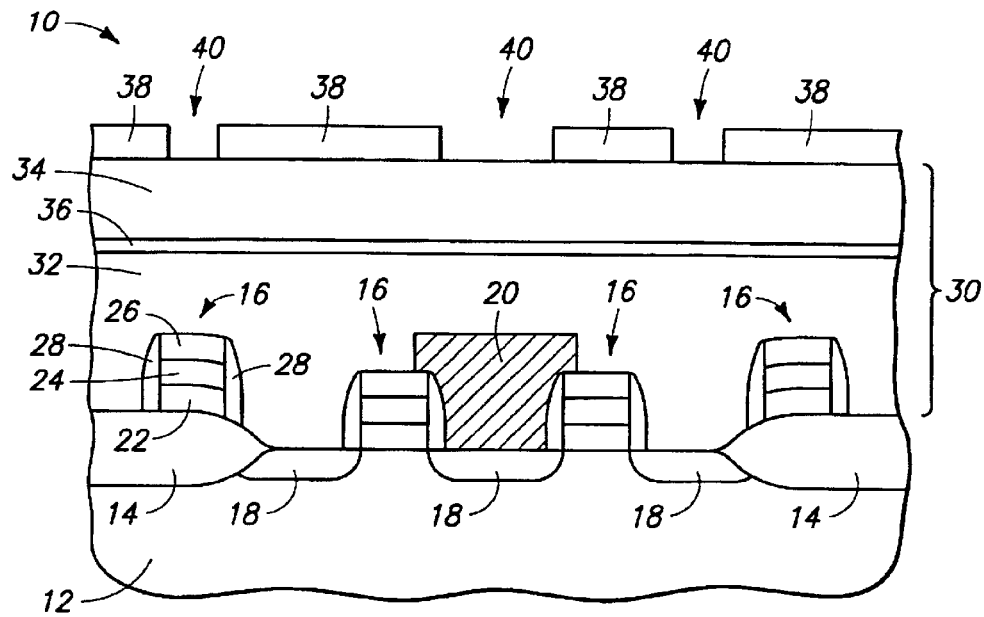
FIG. 3 is a view of the FIG. 2 wafer fragment at a different processing step.

Referring to FIG. 3, a patterned masking layer 38 is formed over substrate 12 and defines a plurality of masking layer openings 40 through which contact openings are to be etched. An exemplary material for layer 38 is photoresist.

Figure 4:
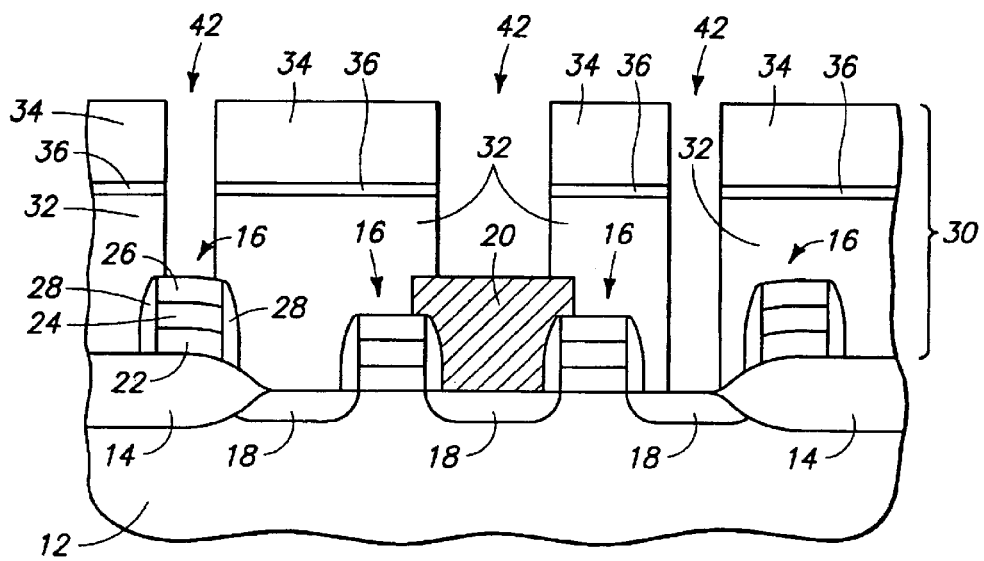
FIG. 4 is a view of the FIG. 3 wafer fragment at a different processing step.

Referring to FIG. 4, contact openings 42 are formed through the plurality of layers 30 and down to the respective circuit devices with which electrical communication is desired. Exemplary etch techniques for forming the contact openings include plasma etching. The photoresist can be subsequently stripped, as shown.

In the illustrated example, contact openings 42 are formed contemporaneously through the three layers 32, 34, and 36, and in a common step. The contact openings respectively extend to proximate a portion of the substrate with which electrical communication is desired. The leftmost contact opening 42 exposes a top portion of the leftmost conductive line 16. Insulative cap 26 can subsequently be etched to expose the conductive portions of the line. The centermost contact opening 42 exposes a portion of conductive plug 20. The rightmost contact opening 42 exposes a portion of the rightmost diffusion region 18. Preferably, at least one of the contact openings has an aspect ratio no less than about 10:1. In the illustrated example, rightmost contact opening 42 has the desired 10:1 aspect ratio, although such is not shown to scale.

Figure 5:
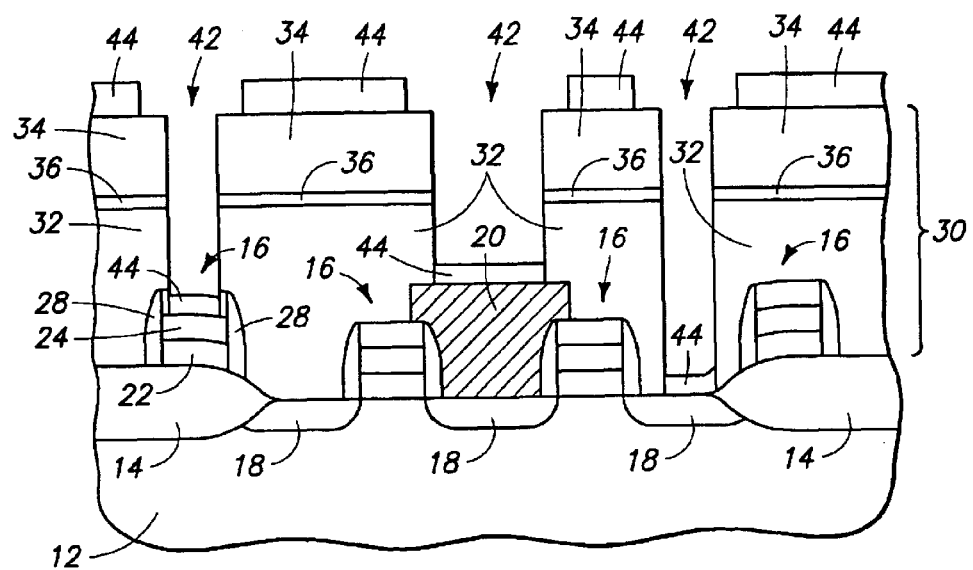
FIG. 5 is a view of the FIG. 4 wafer fragment at a different processing step.

Referring to FIG. 5, a portion of the insulative cap over the leftmost conductive line 16 has been removed to facilitate electrical connection therewith. A patterned masking layer 44 is formed over the plurality of layers 30 and defines a trench pattern, trough pattern, or conductive line pattern over the substrate. An exemplary material for masking layer 44 is photoresist. At least some of the photoresist 44 can remain within contact openings 42 as shown. Such remnant photoresist can serve to protect the device area. Although the trench patterns are illustrated as being generally wider in dimension than the respective contact openings proximate which each is disposed, the patterns could have other dimensions, e.g. narrower or the same width dimensions as the contact openings.

Figure 6:
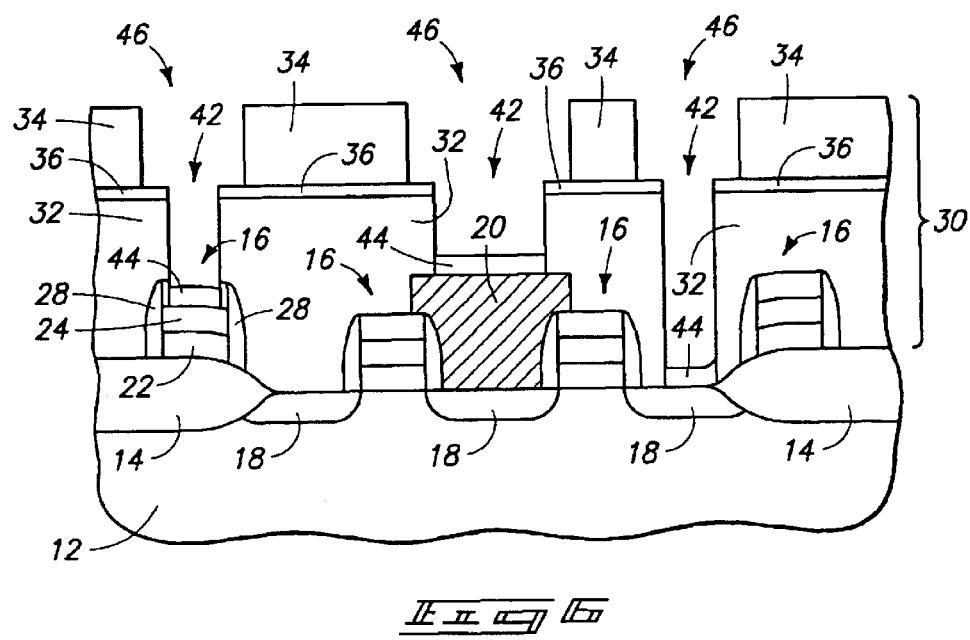
FIG. 6 is a view of the FIG. 5 wafer fragment at a different processing step.

Referring to FIG. 6, material of uppermost insulative oxide layer 34 is etched or otherwise removed substantially selectively relative to etch stop layer 36. Such layer can be plasma etched to provide a somewhat graded or beveled opening. Such defines trenches or troughs 46 which are joined with the respective contact openings over which each is formed. The trench and contact openings are formed to at least partially overlap with one another. The illustrated troughs can be formed while photoresist is within the contact openings. The photoresist will be subsequently stripped.

Figure 7:
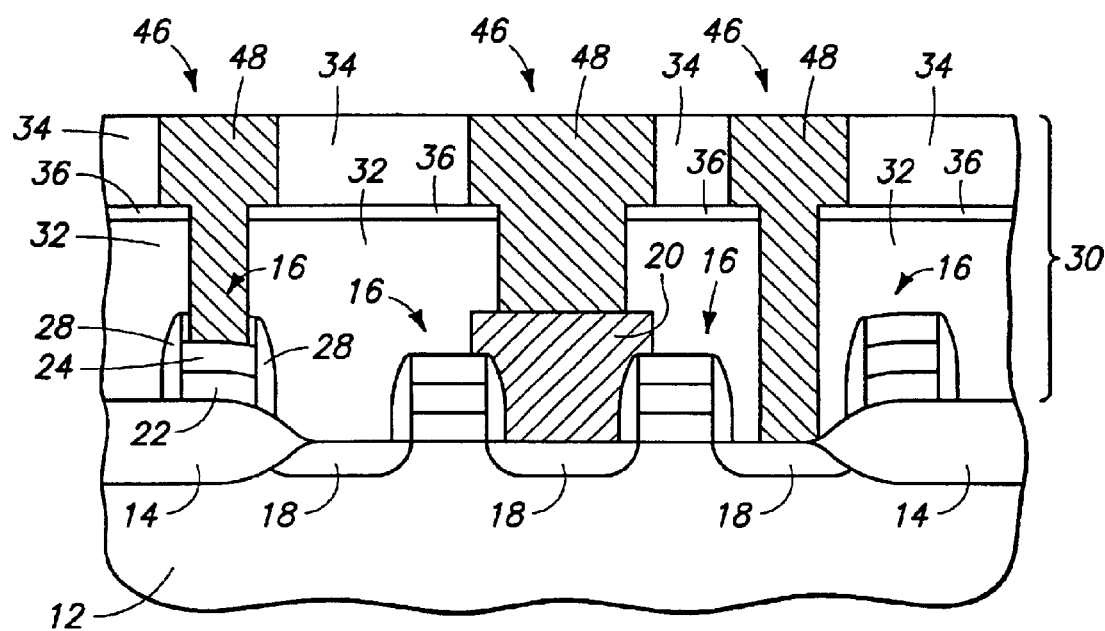
FIG. 7 is a view of the FIG. 6 wafer fragment at a different processing step.

Referring to FIG. 7, contact openings 42 and trenches or troughs 46 are filled, in a common step, with conductive material 48 which can be subsequently planarized, as by CMP, to isolate it within the contact openings and associated troughs. Accordingly, the conductive material within a particular contact opening is in electrical communication with conductive material within an associated trough. Various materials and techniques can be utilized to form the conductive material within the openings and troughs. Such include aluminum alloys formed through hot sputtering and reflow techniques, ionized plasma, hot pressure fill, and PVD/CVD combinations.

In a preferred embodiment, a layer of titanium can be deposited to a thickness of between about 250 Angstroms to 1,000 Angstroms, with 700 Angstroms being preferred. Thereover, a layer of titanium nitride can be deposited to a thickness of between about 150 Angstroms to 600 Angstroms, with 300 Angstroms being preferred. Either or both of the above layers can be deposited by chemical vapor deposition, physical vapor deposition, or other techniques. The wafer or substrate can then be subjected to rapid thermal processing (RTP) in a nitrogen ambient, at atmospheric pressure, and at temperatures between about 600° C. to 800° C. Preferably, such temperature processing takes place in a dual ramping step in which in a first step, the temperature is raised to about 650° C. at a rate of 20° C. per second. Upon achieving 650° C., the wafer is held for approximately 20 seconds at 650° C. Thereafter, the temperature is raised again, from 650° C. to 720° C. at the same ramp rate of 20° C. per second. The wafer is then held at 720° C. for one second. Subsequently, aluminum can be deposited through various techniques including chemical vapor deposition followed by physical vapor deposition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:
   providing a semiconductive substrate;
   providing a first circuit device on the substrate, the first circuit device having a conductive portion and an insulative cap disposed thereon;
   providing a second circuit device on the substrate, the second circuit device being elevationally displaced from the first circuit device;
   forming at least three layers over the substrate and through which electrical connection is to be made to the first circuit device and the second circuit device, the three layers comprising first and second layers having an etch stop layer interposed therebetween;
   in a common step, forming a first contact opening and a second contact opening through the at least three layers, the first contact opening being formed to the insulative cap of the first circuit device and the second contact opening being formed to the second circuit device;
   after forming the first contact opening and the second contact opening, removing at least a portion of the insulative cap to expose an upper surface of the conductive portion;
   forming a patterned layer of photoresist over the substrate to define a conductive line pattern, at least some of the layer of patterned photoresist being received over the second circuit device and the conductive portion of the first circuit device;

selectively etching an uppermost of the first layer relative to the etch stop layer to define a first trough and a second trough, the first trough joined with the first contact opening and a second trough joined with the second contact opening.

2. The method of claim 1, the second circuit device being disposed elevationally below an uppermost portion of the first circuit device.

3. The method of claim 1, the first circuit device comprising a conductive line.

4. The method of claim 1, the second circuit device comprising a conductive node formed within semiconductive material of the semiconductive substrate.

5. The method of claim 1, the first circuit device comprising a conductive line and the second circuit device comprising a conductive node formed within semiconductive material of the semiconductive substrate.

6. The method of claim 1, the removing of at least a portion of the insulative cap comprising an etching process and where the etching exposes less than an entirety of the width of the conductive portion.

7. The method of claim 6, where the conductive portion exposed by the etching has the same width as the contact opening.

8. The method of claim 1, further comprising filling the first and second contact openings with conductive material, the filling comprising:
  depositing a first layer comprising titanium within the first and second contact openings;
  depositing a second layer comprising titanium nitride over the first layer;
  rapid thermal processing the first and second layers, the rapid thermal processing comprising a first temperature ramping step and a discrete second temperature ramping step; and
  after the rapid thermal processing, depositing aluminum to within the first contact opening and the second contact opening, the aluminum overlying the first layer and the second layer within the first and second contact openings, the aluminum being in electrical communication with first circuit device and the second circuit device, respectively.

9. The method of claim 1, wherein the forming of the first contact opening and the second contact opening comprises forming at least one of the openings to have an aspect ratio of about 10:1 or greater.

10. The method of claim 1, wherein the forming of the first contact opening and the second contact opening comprises forming one of the openings to have an aspect ratio of about 10:1 or greater and the other of the openings to have an aspect ratio of less than about 10:1.

11. The method of claim 1, where the common step of forming a first contact opening and a second contact opening through the at least three layers comprises etching the at least three layers, the etching being selective to the insulative cap.

12. A method of forming integrated circuitry comprising:
  providing a conductive line disposed over a semiconductive substrate, the conductive line having a lower conductive portion and an upper insulative cap overlying the conductive portion;
  providing a conductive node on the substrate;
  forming plurality of insulative layers over the substrate and through which electrical connection with the conductive line and the conductive node is to be made, the plurality of layers at least comprising first and second insulative layers having an insulative etch stop layer interposed therebetween;
  in a common step, removing at least some of the three insulative layers to form a first contact opening and a second contact opening through the three layers, the first contact opening exposing a portion of the insulative cap and the second contact opening exposing a portion of the conductive node;
  after forming the first contact opening and the second contact opening, exposing an upper surface of the conductive portion;
  forming a layer of photoresist over the substrate; at least some of the layer of photoresist being received into the first contact opening and the second contact opening;
  patterning the photoresist layer to define a conductive line pattern;
  selectively removing material of an uppermost of the plurality of layers relative the etch stop layer and defining a first trough joined with the first contact opening and a second trough joined with the second contact opening; and
  after the selective removing, filling the joined first trough/first contact opening and the joined second trough/second contact opening with a conductive material.

13. The method of claim 12, wherein the plurality of layers comprises only three layers.

14. The method of claim 12, wherein the uppermost layer of the plurality of layers comprises an oxide material.

15. The method of claim 12, wherein the selective removing comprises plasma chemical etching.

16. The method of claim 12, further comprising after forming the first trough and the second trough, removing photoresist received within the first contact opening and the second contact opening.

17. The method of claim 12, where the filling comprises:
  depositing a first layer comprising titanium within the joined first trough/first contact opening and the joined second trough/second contact opening;
  depositing a second layer comprising titanium nitride within the opening on the first layer;
  rapid thermal processing the first layer and the second layer, the rapid thermal processing comprising a first temperature ramping step and a discrete second temperature ramping step; and
  after the rapid thermal processing, depositing aluminum over the first and second layers.

18. The method of claim 12, where the common step of forming a first contact opening and a second contact opening through the plurality of layers comprises etching layers disposed over the insulative cap selectively to the insulative cap.

19. The method of claim 12, wherein the forming of the first contact opening and the second contact opening comprises forming at least one of the openings to have an aspect ratio of about 10:1 or greater.

20. The method of claim 12, wherein the forming of the first contact opening and the second contact opening comprises forming one of the openings to have an aspect ratio of about 10:1 or greater and the other of the openings to have an aspect ratio of less than about 10:1.

21. The method of claim 1 wherein the common step includes a common masking step.

22. The method of claim 1 wherein the common step includes a common masking step using photoresist.

23. The method of claim 12 wherein the common step includes a common masking step.

24. The method of claim 12 wherein the common step includes a common masking step using photoresist.

25. The method of claim 12 wherein the conductive node comprises a diffusion region formed within semiconductive material of the substrate.

26. A semiconductor processing method of forming integrated circuitry comprising:

provi ding a conductive line formed over a substrate, the conductive line having a conductive portion and an insulative cap received on the conductive portion;

forming at least three layers over the substrate and cap, the three layers comprising first and second layers having an etch stop layer interposed therebetween;

in a common masking step, forming a contact opening through the at least three layers to the insulative cap over the conductive line;

after forming the contact opening to the insulative cap, etching the insulative cap to expose the conductive portion of the conductive line;

forming a layer of photoresist over the substrate and into the contact opening onto the conductive portion of the line;

patterning the photoresist to define a conductive line pattern, at least some of the photoresist being received within the contact opening on the conductive portion of the conductive line after the patterning; and while photoresist is within the contact opening on the conductive line portion, selectively removing material of an uppermost of the-first layer relative to the etch stop layer and defining a trough joined with the contact opening.

27. The semiconductor processing method of claim 26 wherein at least some of the insulative cap remains over the conductive portion of the line after the etching.

28. The semiconductor processing method of claim 26 wherein the etching of the insulative cap exposes less than an entirety of the width of the conductive portion.

29. The semiconductor processing method of claim 26 wherein the conductive portion exposed by the etching has the same width as the contact opening.

30. The semiconductor processing method of claim 26 wherein the photoresist received on the conductive portion of the line has a thickness which is less than that of the insulative cap.

31. The semiconductor processing method of claim 26 further comprising removing the photoresist from over the conductive portion of the line and thereafter filling the contact opening with conductive material, the filling comprising:

depositing a layer comprising titanium within the opening;

depositing a layer comprising titanium nitride within the opening over the layer comprising titanium;

rapid thermal processing the titanium nitride comprising and titanium comprising layers within the opening, the rapid thermal processing comprising a first temperature ramping step and a discrete second temperature ramping step; and after the rapid thermal processing, depositing aluminum to within the opening.

* * * * *

UNITED STATES PATENT AND TRADEMARK OFFICE
CERTIFICATE OF CORRECTION

PATENT NO. : 6,787,447 B2
DATED : September 7, 2004
INVENTOR(S) : John H. Givens It is certified that error appears in the above-identified patent and that said Letters Patent is hereby corrected as shown below:

<u>Title page,</u>
Item [57], ABSTRACT,
Line 14, please delete "embodiment" after "some" and insert -- embodiments --.

Signed and Sealed this

Fifth Day of April, 2005

JON W. DUDAS
*Director of the United States Patent and Trademark Office*